(12) United States Patent
Hughes et al.

(10) Patent No.: US 6,373,758 B1
(45) Date of Patent: Apr. 16, 2002

(54) SYSTEM AND METHOD OF OPERATING A PROGRAMMABLE COLUMN FAIL COUNTER FOR REDUNDANCY ALLOCATION

(75) Inventors: Brian William Hughes, Fort Collins; Warren Kurt Howlett, Windsor, both of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/792,320

(22) Filed: Feb. 23, 2001

(51) Int. Cl.[7] .................................................. G11C 29/00
(52) U.S. Cl. ........................ 365/200; 365/201; 365/236
(58) Field of Search ................................. 365/200, 201, 365/230.06, 236

(56) References Cited

U.S. PATENT DOCUMENTS

| 5,255,227 A | 10/1993 | Haeffele ..................... 365/200 |
| 5,495,447 A * | 2/1996 | Butler et al. ................. 365/200 |
| 5,793,686 A * | 8/1998 | Furutani et al. ............. 365/201 |
| 5,795,797 A * | 8/1998 | Chester et al. .............. 365/200 |
| 5,848,077 A | 12/1998 | Kamae et al. ................. 371/53 |
| 6,000,047 A | 12/1999 | Kamae et al. .............. 714/710 |
| 6,141,779 A | 10/2000 | Hill et al. .................... 714/710 |

* cited by examiner

Primary Examiner—Huan Hoang

(57) ABSTRACT

The present invention includes a system and a methodology for eliminating faulty memory cells in a memory array with replacement columns of memory cells and replacement rows of memory cells. The individual memory cells are checked to ensure that each is operational. Non-operational cells are replaced by first replacing columns which contain a threshold number of non-operational cells with spare columns and second removing any remaining non-operational cells by replacing the rows containing those non-operational cells with spare rows.

20 Claims, 9 Drawing Sheets

SYSTEM AND METHOD OF OPERATING A PROGRAMMABLE COLUMN FAIL COUNTER FOR REDUNDANCY ALLOCATION

RELATED APPLICATIONS

The present invention relates to commonly assigned, co-pending U.S. patent application Ser. No. 09/777,202, entitled "A SYSTEM FOR AND METHOD OF OPERATING A PROGRAMMABLE COLUMN FAIL COUNTER FOR REDUNDANCY ALLOCATION," filed Feb. 2, 2001; and commonly assigned, concurrently filed U.S. patent application Ser. No. 09/792,476, entitled "CACHE TEST SEQUENCE FOR SINGLE-PORTED ROW REPAIR CAM," the disclosures of which are hereby incorporated herein by reference.

TECHNICAL FIELD

The present invention relates to a semiconductor memory device, and more particularly to a semiconductor memory device having spare memory cells for replacement of defective memory cells which are then programmably accessible.

BACKGROUND

Modem microprocessors and many Application Specific Integrated Circuits (ASICs) often incorporate large amounts of embedded memory. This memory is typically Static Random Access Memory (SRAM) or Dynamic Random Access Memory (DRAM). These Random Access Memories (RAMs) constitute the majority of transistors contained on a chip and can occupy the largest portion of the surface area of a chip, i.e., chip "real estate." Availability and usability of these RAMs becomes a priority to semiconductor manufacturers. Typically semiconductor manufacturers incorporate a test and a repair scheme which tests RAM cells within the chip and replaces defective RAM cells with spare cells included for that purpose. Typically, columns and/or rows of RAM cells are replaced rather than individual RAM cells. Row substitution may be performed by appropriate changes to the address decoder while column substitution may be performed by MUX selection of appropriate bit lines.

Traditionally, semiconductor manufacturers have used bit maps to determine which RAM columns and/or RAM rows need to be replaced with redundant RAM columns or RAM rows. Identification of defective memory cells is a particular problem when embedded on a microprocessor or ASIC device, since external or off-chip access for testing is limited by the number of pins available. Thus, semiconductor manufacturers have incorporated Built In Self Tests (BISTs) and Built In Self Repair (BISRs) to test and replace RAM cells. Special purpose built-in test hardware is described in detail in the commonly assigned and co-pending U.S. patent application entitled, "A Flexible And Programmable BIST Engine for On-Chip Memory Array Testing and characterization," Ser. No. 09/183,536, filed on Oct. 30, 1998 and hereby incorporated, in its entirety, by reference.

Typically RAM cells are tested for a number of faults which can be classified into two categories, simple faults and linked faults. Simple faults are those which occur independent of other faults but may induce failures in other cells. Linked faults are when two or more simple faults are acting on a single cell (i.e. multiple faults influencing each other). Simple faults can be further divided into Address Decoder Faults (ADFs) and Memory Cell Array Faults (MCAFs). ADFs are only present in the address decoder and result in the unavailability of a cell, the lack of an address to access a cell, an address accessing multiple cells, or a specific cell being accessible with multiple addresses.

MCAFs can be further broken down into single cell faults and faults which occur between memory cells. Single cell faults include Stuck At Faults (SAFs), Stuck Open Faults (SOFs), Transition Faults (TFs), and Data Retention Faults (DRFs). SAF means a specific cell is either "stuck" at zero or "stuck" at one regardless of the data attempted to be written into the cell. SOF indicates that a memory cell cannot be accessed because of an open line. A TF occurs when a memory cell cannot make a transition from zero to one, or from one to zero. And finally, a DRF occurs when a cell is unable to retain a particular logic value or state for a requisite period of time.

Coupling faults involve two cells. A first cell, the coupling cell, which is the source of the fault, and the second cell, the coupled cell, which is the cell that experiences the fault. These coupling faults can occur either when a transition occurs in the coupling cell or when a specific value is stored in the coupling cell. Transitions in a coupling cell can cause the coupled cell to change from a zero to a one, or vice versa, or can cause a zero or a one to be stored within the coupled cell. Additionally, certain values in coupling cells may bleed through to a coupled cell regardless of the value which should be stored in the coupled cell.

Tests which are applied in parallel to a plurality or group of memory cells, or march tests, consist of a sequence of elements, or "march elements," in which a sequence of operations are defined and corresponding data signals are applied to various memory cells, typically one row or column at a time. The overall memory can be divided into memory groups and these tests can occur in parallel across memory groups. The address order determines the order in which the march test is applied to various address locations within a memory group. A march test may contain the following sequence: write zero, read zero, write one, read one, write zero, read zero. This march test would ensure that a zero could be stored in, and read from, a memory cell, that a one can be stored in, and read from, a memory cell, and that the memory cell can transition from a zero to a one, and from one to zero. These march tests are performed on the memory cells during BIST.

Once faulty memory cells have been identified, BISR is used to replace the faulty memory cells with spare memory cells. This typically occurs a column or row at a time or using multiple spare columns or rows to replace a continuous group of columns or rows (e.g., an address space spanning several rows or columns). Semiconductor manufacturers also combine BIST and BISR in accordance with their testing philosophy. BIST could be completed before the BISR has been implemented and not repeated after array reconfiguration in which faulty rows or columns are replaced with spare ones. Thus, if BIST is completed before BISR is performed, the replacement columns and rows are not typically tested during BIST and columns and rows of cells would be included in the operational memory array which have not successfully passed BIST.

Alternatively, and more preferably, BIST and BISR can occur alternatively to ensure that each of the memory cells contained in the final (operational) memory array configuration have been thoroughly tested. For instance, one march test may occur during the first pass of BIST and be used to identify faulty memory cells. Once these faulty memory cells have been identified, a first pass of BISR can be used to replace the rows and/or columns of memory which contain these faulty memory cells. Once the first pass of BISR has been completed, the second pass of BIST can be performed which repeats the first BIST pass or which includes additional march tests to ensure that the replacement rows and/or columns, as configured, are operating properly. A second pass of BISR would be performed at the conclusion of the second pass of BIST to replace any newly identified or remaining faulty rows and/or columns. In addition, other march tests can be performed which test for coupling problems between memory cells in the reconfigured array. A BIST, which identifies memory cells with faults, is always followed by BISR, or the memory array is unrepairable and discarded.

Once a row of memory containing a non-operational cell has been identified, its address is typically stored and mapped to a redundant row. This mapping may occur after each row containing a non-operational cell has been identified, or alternatively, testing may be suspended while the row containing the non-operational cell is mapped to a redundant row. Once the mapping is completed, testing of the remaining rows is resumed. For memory addresses which cannot be accessed or stored in a single clock cycle a pipeline may be implemented to allow the access or storage to occur over numerous clock cycles.

A description of memory testing and the use of redundant memory elements is described in detail in the commonly assigned U.S. Pat. No. 6,141,779 issued Oct. 31, 2000, and co-pending U.S. patent application entitled, "System and Method for Providing RAM Redundancy in the Field," Ser. No. 09/544,516 filed on Apr. 6, 2000, both herein incorporated, in their entireties, by reference. Also U.S. Pat. No. 5,255,227 issued Oct. 19, 1993 to Haeftele, U.S. Pat. No. 5,848,077 issued Dec. 8, 1998 to Kamae et al. and U.S. Pat. No. 6,000,047 issued Dec. 7, 1999 to Kamae et al., each commonly assigned to the assignee of this patent describe similar correction methods and are herein incorporated, in their entirety, by reference.

While BIST and BISR provide enhanced testing facilities and rehabilitation of faulty devices, the additional test and repair circuitry and time used limits incorporation of these tools into the already cramped chip real estate. Accordingly, a need exists for a systematic method and approach to test the memory cells contained within a memory array that will minimize the amount of time spent in BIST and BISR while maximizing the identification of faulty memory cells. A need further exists for the efficient use of redundant memory columns and redundant memory rows in the replacement of faulty memory cells. A further need exists for the identification and replacement of faulty memory cells while minimizing the hardware associated with the BIST, BISR, and surface area of the chip dedicated to BIST and BISR.

SUMMARY OF THE INVENTION

The identified needs, additional advantageous features and technical advantages are achieved by a system and method of eliminating faulty memory cells from a memory array, the method comprising the steps of detering if cells in each column of the memory array are operational (i.e., are not faulty), replacing columns of the memory array which include more than a predetermined number (e.g. one) of non-operational cells with spare columns and, once these columns are replaced, using one or multiple spare rows to replace any row (and, in the case of multiple spares, adjacent rows) which contains one or more non-operational cells. As used herein eliminating means electrically bypassing or switching in substitute cells without physically removing the non-operational cells. The determination of operational versus non-operational cells may include the testing of each memory cell within the memory array and the number of defective cells within a column may be counted to determine when column replacement should be used because a threshold value has been reached or surpassed or based on the actual number of failed memory cells within the column.

The test used to determine whether the memory cell is operational or not may comprise the steps of generating at least one memory address, writing data to the generated memory address, reading data from the memory address, and comparing the data read from the memory address with the data which was written to the memory address. The configuring of columns of the memory array may be performed by bit line multiplexers which are used to shift-in a replacement column (or group of replacement columns) of memory cells into the array. The configuring of rows of the memory array may include translating or alternately decoding a row address signal which designates which rows are included in the memory array and which rows are excluded from the memory array. One or more spare rows may be selected to replace rows containing non-operational cells with the rows being replaced. Additional testing may be performed after the columns containing more than one non-operational cell are replaced with spare columns. Built-in self test may be used to perform the testing to determine non-operational cells and built-in self repair may replace the columns and the rows with spare columns and rows respectively.

Another embodiment of the invention includes a system for eliminating faulty memory cells from a memory array, the system comprising a memory cell tester which determines non-operational cells, a column selector or "reconfigurer" which replaces columns having more than one (or some other predetermined value of) non-operational cells with a spare column, and a row reconfigurer which replaces any row containing non-operational memory cells remaining after column replacements have been made with spare rows. The memory cell tester may count the number of non-operational cells in each of the columns and use that number to determine the columns which should be replaced by spare columns, or may use a threshold value based circuit (e.g., saturation counter) that ensures columns with a number of non-operational cells which equal or exceed the threshold be replaced with spare columns. The memory cell tester may include a memory cell data write circuit or "writer" which writes values into the memory cell, a memory cell data read circuit or "reader" which reads values from the memory cell, a first register to store the value written into the memory cell and a comparator which compares the value read from the memory cell to the value stored in the first register. A second register may be used to record a count, representing the results from the comparator. The column reconfigurer may comprise a bit line multiplexer used to shift a replacement column of memory cells into the memory array. The row reconfigurer may comprise a row address signal which is used to select one or more spare rows of memory cells to replace rows of memory cells which contain non-operational cells.

Another embodiment of the invention reverses the preferred column first, row second ordering and comprises a method of eliminating faulty memory cells from a memory array which "looks at" or tests and performs reconfiguration of the rows first and then the columns. In this embodiment, a determination is made of the number of non-operational cells in each of the rows of the memory array, rows having more than a set predetermined or dynamically adjusted number of non-operational faults being replaced with spare rows. Once those non-operational memory cells are effectively "removed" from the memory array, the columns containing non-operational memory cells are identified and spare columns are used to eliminate the columns containing the non-operational cells from being included in the memory array. The determination as to whether a cell is operational or non-operational includes a step of testing the memory cells of the memory array to determine defective cells and counting the defective cells in each of the rows. The count itself can be used to determine the rows which should be replaced with spare rows or a threshold and corresponding boolean value may be used. The memory cell testing comprises the steps of generating at least one memory address, writing data to the memory address, reading data from the memory address, and ensuring the correct data was read from the memory address. A register may be used in this testing. Configuring the rows of the memory array may include a step activating an alternate word line to shift in a replacement row of memory cells into the array or otherwise access the replacement row or rows.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawing, in which.

DETAILED DESCRIPTION

Figure 1:
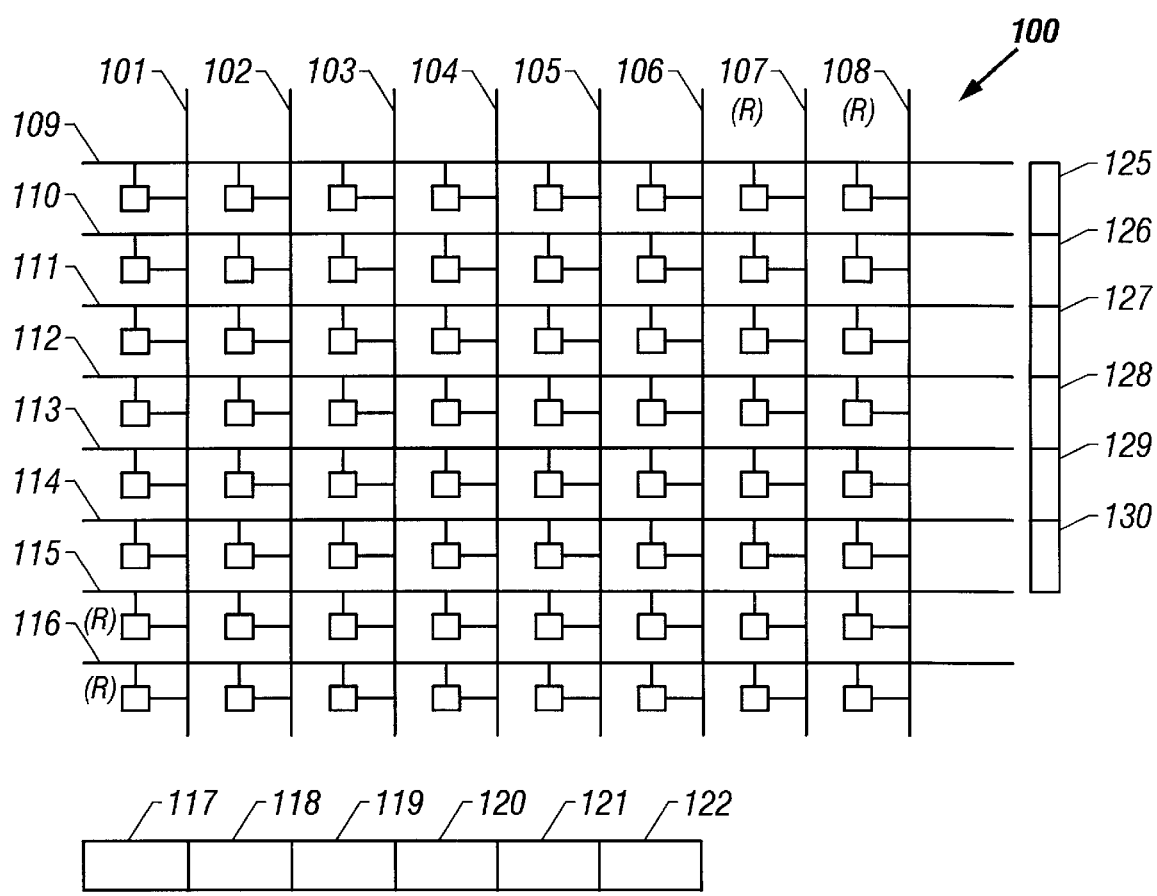
FIG. 1 is a diagram of an eight by eight memory cell array with an associated row of counters according to the invention.

The present invention incorporates built-in self test and self repair functionality into a semiconductor memory device in which reconfiguration data used to replace faulty memory is stored at the same time testing to identify other faulty memory cells continues. The invention minimizes memory required to monitor and record errors by taking an iterative approach to detecting and immediately initiating repairs. Because the invention does not store large amounts of test results that might otherwise be required for post-test analysis performed by other repair schemes, the invention is particularly applicable to embedded memory structures and built-in self testing (BIST) and built-in self repair (BISR.) That is, by implementing an efficient method for testing and, in parallel, repairing cell faults, the invention minimizes BIST and BISR hardware requirements.

In particular, the invention dynamically determines a fault threshold value, used to determine whether a column should be replaced, as a function of a number of remaining (i.e., unused) spare rows or row groups. For example, the threshold may be set equal to one more than the number of unused spare rows. Thus, if a number of faults in a column exceeds a number of faults "fixable" by mere row substitution, then the column is a "must fix" and is replaced. Conversely, if the number of faults might be fixed by subsequent row replacement then, at least on an initial pass, column replacement may be delayed until row testing and repair. Preferably, subsequent column testing will use a smaller threshold value, either because one or more rows or row groups are used during intervening row testing and repair, thereby causing a corresponding decrease in the threshold value, or because the threshold value is intentionally decremented by some value. This feature avoids a possible stalemate between column and row repair where each process waits for the other to make a first repair.

Preferably, the number of faults represents the number of faulty cells in the column, i.e., does not double or triple count cells exhibiting multiple faults, counting each faulty cell once regardless of the number of faults exhibited by the cell. According to another feature, the number of faults equals the number of faulty row groups without double counting multiple cell faults within a row group since it is expected that all cells within a group would be replaced by any subsequent row repair.

After replacement of columns or column groups satisfying a threshold value based on the number of remaining spare rows or row groups, row testing and repair is performed. Preferably, row testing also includes counting of faulty cells in each row. Thresholding may again be used to determine which rows are to be replaced during the current iteration or cycle, the threshold a function of a number of remaining spare columns or column groups. As in the case of the column replacement threshold value, the row replacement threshold is decreased each cycle of the process, either due to replacement column usage or intentional decrementing of the row replacement threshold value by some value, e.g., one. Of course, both the initial column and row replacement threshold and decrement values may be fine tuned to allow the process to converge quickly, i.e., to minimize the number of test/repair cycles while maximizing the number of repairable faults.

As explained, after a first iteration or cycle of column testing and repair followed by a row testing and repair, if required, a second cycle of column followed by row testing and repair is initiated with the respective threshold values decremented, but not less than some predetermined value, e.g., one. This is followed by any necessary subsequent cycles until either all faults are repaired or all spare memory columns and rows are used with faults still remaining. In the former case, the memory has been successfully repaired while, in the case of the latter, the memory cannot be completely repaired and is defective. Further, while the invention is described in terms of column test and repair followed by row test and repair, the order may be reversed. The invention may also be expanded to encompass multidimensional memory arrays or other memory segmentations wherein more than two types of structures (e.g., spare rows and columns) may be available for memory array repair (e.g., row, column, stack in the case of a three dimensional memory or subarray, column, row in the case of a segmented two dimensional array, etc.)

FIG. 1 is a diagram of a memory array that contains eight columns, each column including a corresponding bit line (101–108), and eight rows, each having a common word line (109–116). (It is understood by those skilled in the art that the 64 bit memory is presented by way of example and for ease of illustration, semiconductor memories typically including much larger blocks of memory cells.) Columns 107, 108 and rows 115 and 116 are redundant including spare memory cells usable to replace faulty memory cells. Note that the redundant columns and rows need not be adjacent to the ones under test, but could be remote therefrom.

Each of the six non-redundant bit lines 101–106 also has an associated counter register 117–122. For example, cell failures associated with bit line 101 are recorded in counter 117, failures on bit line 102 are recorded in counter 118, and so forth. At the completion of a BIST pass, counters 117 through 122 contain a value which represents the number of memory errors which occurred during a march test of memory column 101 through 108, respectively. According to one embodiment, the count represents a total number of errors for all cells including multiple errors from a single cell (i.e., without regard to whether the errors represent multiple errors from a smaller number of cells or single errors from as many cells). Other implementations may distinguish between the number of failed cells by discounting multiple failures from a single cell, while other implementations may use a threshold counter to provide a single flag bit indicating a column pass/fail condition.

Still another implementation segments the columns according to row groups, providing a single count for each inoperative segment of the column caused by a failure of any cell of the segment. For purposes of illustration, we might assume that both columns and rows are grouped in pairs, i.e., replacements occur in pairs of either columns or rows. Thus, columns 101 and 102 form one column group for purposes of testing and repair, columns 103 and 104 form a second column group, and so on. Similarly, word lines 109 and 110 are paired to form a first row group, word lines 111 and 112 to form a second row group, etc. According to this grouping, column 101 is divided into three segments for purposes of testing, a first segment including memory cells associated with word lines 109 and 110, a second segment including memory cells associated with word lines 111 and 112, and a third segment including memory cells associated with word lines 113, 114. For the purposes of this example, the memory cells associated with spare word lines 115 and 116 form a spare segment of column 101. According to this division, counters 117 through 122 contain values which represent the number of respective inoperative column segments identified during a march test of memory column 101 through 106, respectively. Thus, if a particular column has an unacceptable number of bad segments, repair processing can be initiated. This aspect of the invention has the advantage of taking into consideration the nature of the technique used to repair a column or row, i.e., multiple columns or rows are replaced at a time. Thus, the groupings of multiple rows to form a row group and/or multiple columns to form a column group defines respective address spaces of memory cells.

Similarly, for counting purposes, each row may be divided into a plurality of segments corresponding the column groupings. Thus, the row associated with word line 109 is divided into three segments, a first including columns 101 and 102, a second including columns 103 and 104, and a third segment including columns 105 and 106. Memory cells in columns 107 and 108 are in a spare segment of row 109. Row faults associated with the memory cells of write lines 109–114 may be tracked by respective counters 125 through 130. The counters may be incremented in response to each fault detected in an associated row, a number of memory cells identified as faulty in the row, or the number of faulty row segments. Another embodiment includes saturation type counters which provide an predetermined output upon counting up to a predetermined threshold value.

Figure 2:
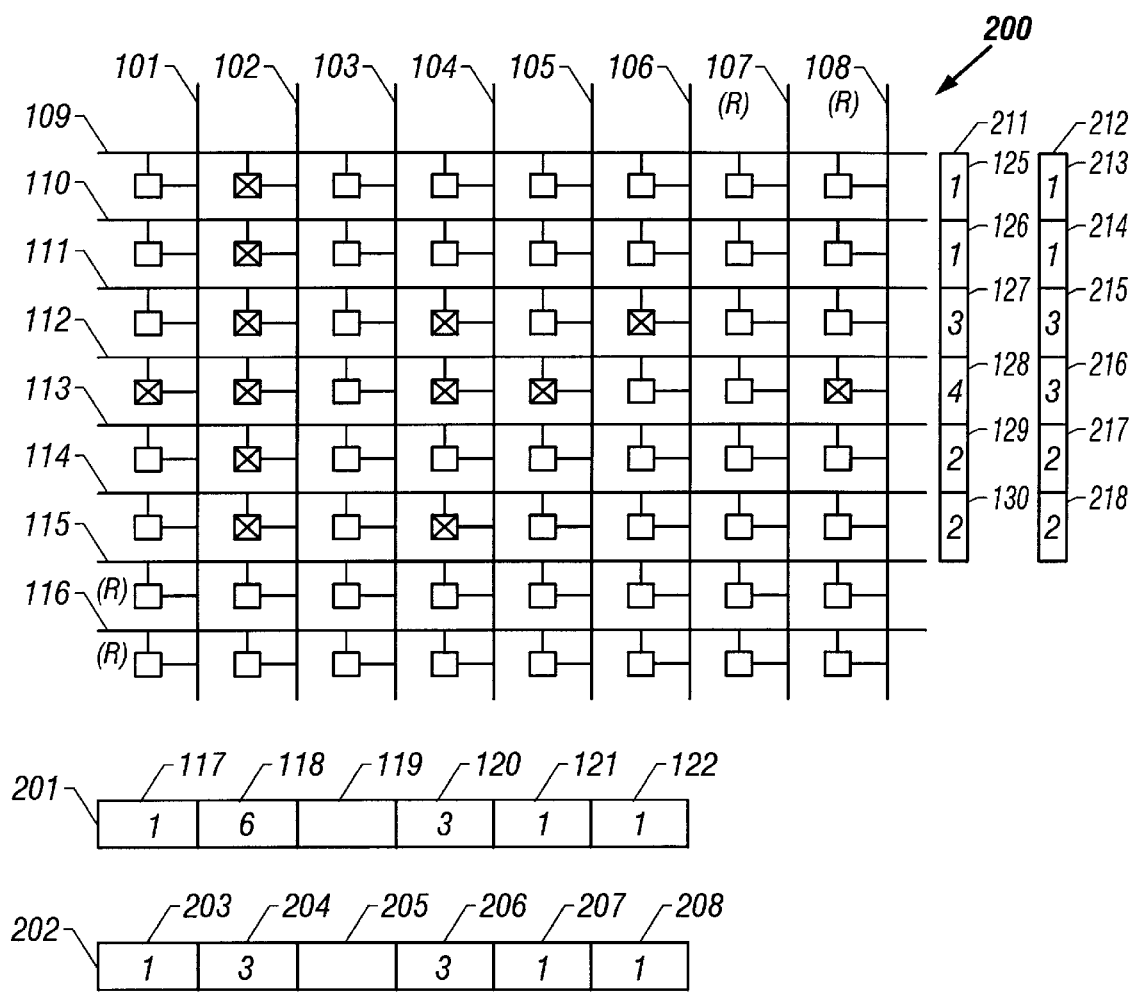
FIG. 2 is a diagram of an eight by eight memory cell array which contains a number of memory cell failures with associated rows of registers storing a total error and a saturated error count.

FIG. 2 is a diagram which shows a number of faults, indicated by the "x's", in an eight column, eight row memory array the first six columns and rows being an active portion subject to test and repair, the last two rows and columns comprising pairs or spare memory cell rows and columns, i.e., a redundant row group and a redundant column group. The configuration depicted includes both normal counters and saturation counters, although it is expected that a commercial implementation would select just one type of counter and not include both. For example, a preferred embodiment of the invention includes saturation counters. According to this implementation, at the completion of the first pass of BIST, each memory counter cell 117–122 of counter row 201 will contain the number of failed memory cells in a respective column of the six by six memory array (spare memory cells are generally not tested as part of BIST, although could be). For instance, if testing of the memory cells in column 101 resulted in one error being detected then counter cell 117 would contain value 1 as shown. Similarly, the memory cells in memory column 102 contains six memory cell faults and therefore memory counter cell 118 contains the value six. Alternatively, a semiconductor manufacturer may not be interested in the specific number of memory cell faults within a specific column and may instead decide to replace the memory column with a redundant column after a certain threshold value of memory cell faults occurs in that column, saturating the respective counter cell. Counter row 202 is an example of a counter row which saturates at a value of three, i.e., the memory counter cells are saturated after three memory cells have failed in that column; while subsequent memory cells may be tested and result in the detection of additional failures, the associated counter value no longer increases. Accordingly, for the six by six memory cell 200, counter cells 204 and 206, where each column contained three or more errors, now contain the number 3 in the saturated counter row. Thus, saturation counters may provide a simple go (e.g., less than three faults detected) or no-go (three or more faults) indicator as an output signal instead of, or in addition to, an actual count value.

Also included in this configuration are counter cells 125–130 of counter column 211 and saturation counter column 212 including saturation counter cells 213–218. Each of the counter cells is configured to record a number of faults associated with respective word lines 109–114. As previously detailed, the fault count may represent a total number of failures experienced during testing of memory cells of a word like (i.e., row), a total number of faulty memory cells in the row; or the total number of faulty row segments. Although values are shown in these counter cells, values would not be obtained in practice until subsequent row testing described below.

Once the number of memory cell faults in each column has been tabulated, and the first step of BIST has been completed, the first pass of BISR can be performed by substituting a redundant column (or columns of a column group) for any column (and adjacent columns) which have failed the first pass of BIST. Failing the first pass of BIST means that a particular column had at least a threshold number of memory cell (column segment) faults. The threshold value is preferably a function of the number of available, i.e., unused, spare rows or row groups. That is, if the number of faulty memory cells identified in a column exceeds the number of spare rows available to replace those memory cells, then this is a "must fix" situation for column replacement. Alternatively, if the number of faulty memory cells is equal to or less than the number of spare rows still available, then repair may be effected subsequently using row replacement. According to another embodiment, the threshold value may be set to be equal to or something less than the number of spare rows available so that column replacement occurs earlier and the number of cycles to affect all repairs is reduced, this at the possible cost of an increased misallocation of spare memory cell resources.

For the semiconductor manufacturer that has implemented counter row 201, a search must be made among the various counters to determine which counters are high enough, i.e., satisfy the threshold value, to require the use of a redundant column. For the semiconductor manufacturer that implements the saturated counter 202, using a saturated value of 3, columns 102 and 104, which correspond to counter locations 204 and 206, respectively will be replaced with redundant columns. Whether saturated counters or maximum counter values are used, the selected threshold value determines the threshold between memory cells repaired by column replacement and row replacement. Once columns 102 and 104 have been replaced, the memory cell failures associated with those columns have been removed from the operational memory by replacing those columns with redundant columns.

While the present embodiment describes replacing a single column with a redundant column, it would be apparent to one of ordinary skill in the art that multiple columns, or blocks of columns, may be replaced with multiple redundant, or redundant blocks of columns. Replacing columns in blocks (i.e., a column group) rather than individually may be desirable because many faults may affect more than a single column. In this case, replacing groups of columns is more effective than replacing individual columns. A column group may include one or more columns.

Figure 3:
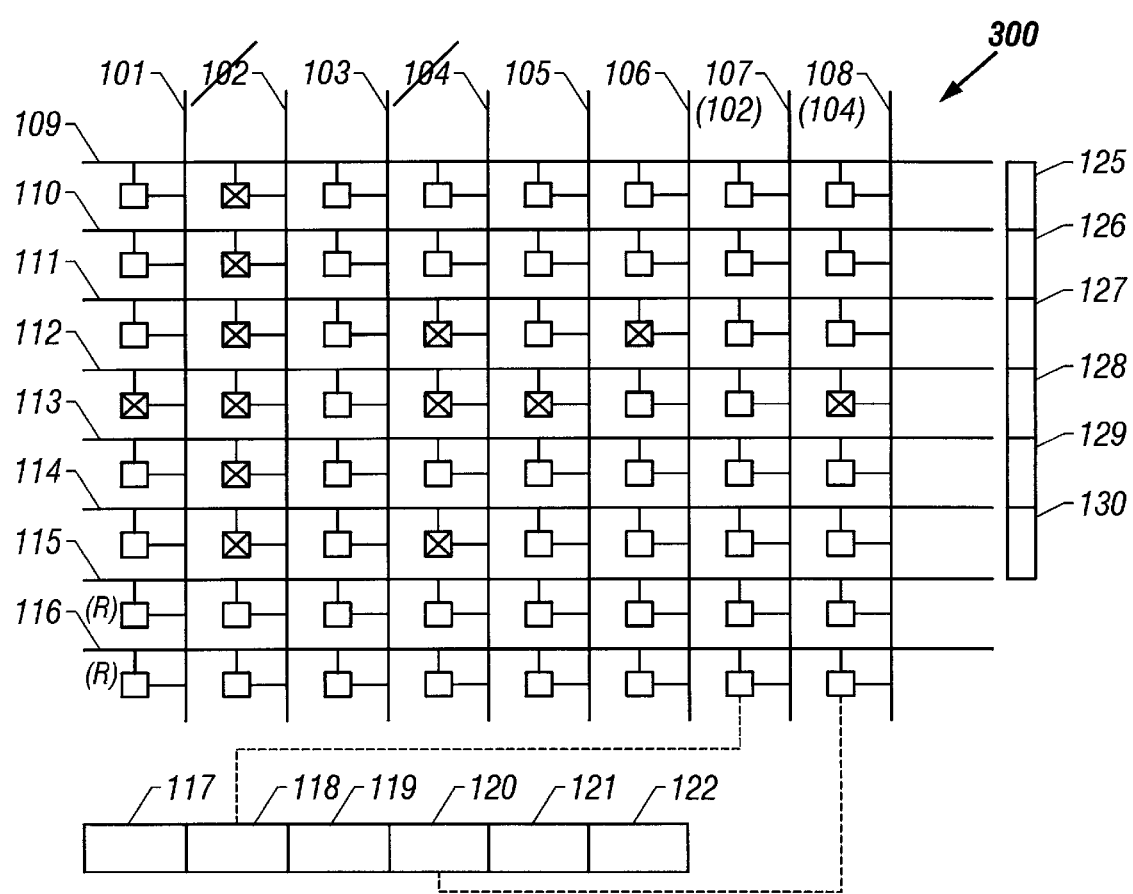
FIG. 3 is a diagram of an eight by eight memory cell array of FIG. 2 after redundant columns are configured to eliminate columns associated with saturated counter values.

FIG. 3 is a diagram of the memory array once columns 107 and 108 have been substituted for columns 102 and 104. As can be seen from FIG. 3, the cells which contain errors are no longer included in the active memory array. Also shown in FIG. 3 is the new mapping between the replacement columns 107 and 108 with memory cell counters 118 and 120. The second step in the BISR is an identification of the rows which contain errors and a replacement of those rows having at least a threshold number of faults with redundant rows. In the present example, since both available redundant columns have been used, the row replacement threshold vale is set to one, i.e., one greater than the number of unused redundant columns. However, had, for example, only one of the two redundant columns been used, then the row replacement threshold value might be equal to two so that a single faulty memory cell in a particular row might not trigger a row replacement.

As can be seen from FIG. 3, rows 111 and 112 contain memory cells with faults and, preferably, will be replaced with redundant rows. As explained, in the case of column repair, row replacement may be accomplished based on some threshold value of memory cell or number of faulty row segments. The process would then repeat by reexamining columns for any faults remaining after this first cycle of column followed by row replacement. Several cycles, each cycle implementing a lower threshold value, may be executed until all faults are addressed or all spare memory is used.

Figure 4:
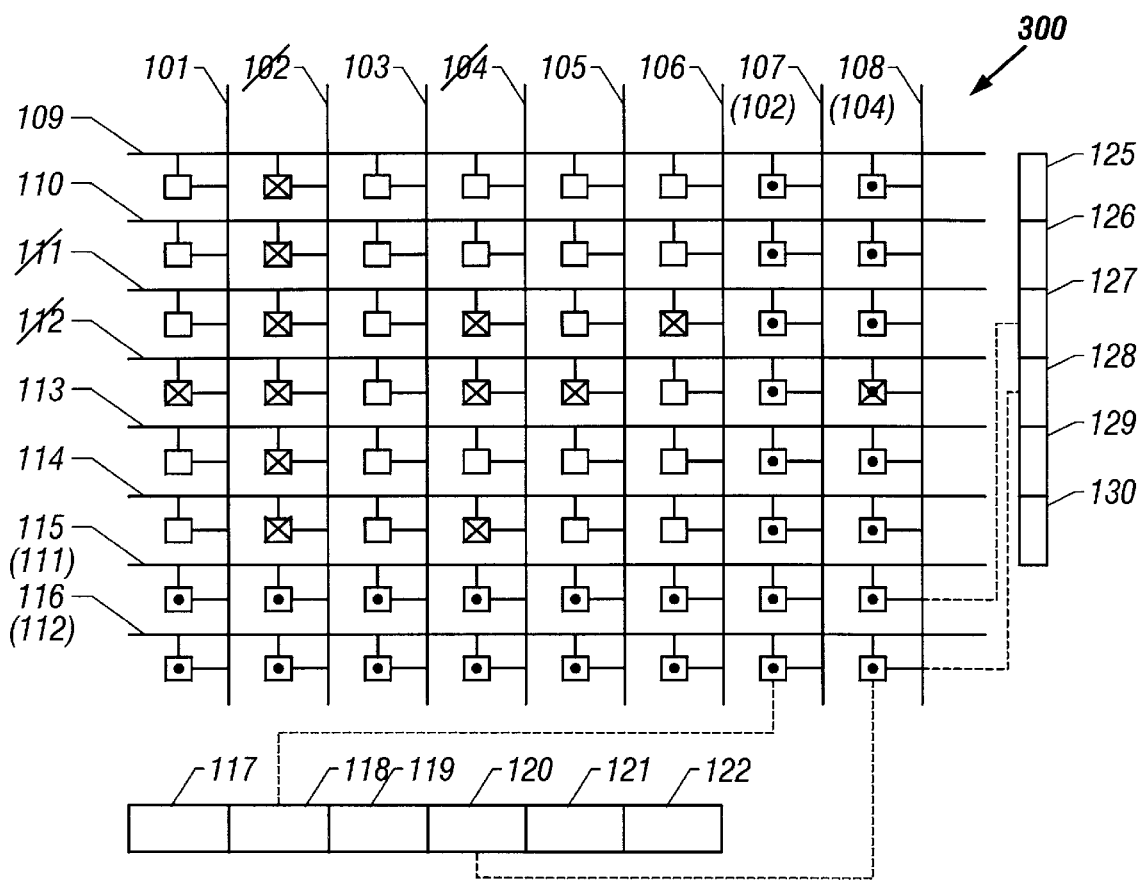
FIG. 4 is a diagram of an eight by eight memory cell array of FIG. 3 after redundant rows are configured to eliminate all remaining rows which contain faulty memory cells highlighting untested cells.

FIG. 4 is a memory array diagram which shows the absence of remaining faults (shown by the absence of x's in the active memory cells) after rows 111 and 112 have been replaced by redundant rows 115 and 116. The redundant rows 115 and 116 are also mapped to the memory counter cells 127 and 128. As can be seen from FIG. 4, the use of two redundant columns and two redundant rows eliminate all of the memory cells which contained faults from the active memory array, including the memory fault in column 108 from the operational memory. However, these replacement rows and columns have not been tested. The dots in the memory cells in FIG. 4 indicate the untested cells.

Typically, with normal size memory arrays, only a small number of columns and/or rows are effectively replaced. Since an array in which replacement columns or rows have been used contains untested cells, a second pass of BIST must be run to ensure that each of the replacement memory cells contained within the memory array performs satisfactorily. BIST is again performed to identify the memory cells which contain faults, and the number of memory cell faults contained within each of the columns. As with the first BIST pass, columns containing memory faults which saturate the counter bit, or contain errors in excess of a predetermined number, are replaced with redundant columns. Once those redundant columns have electrically or logically replaced columns which saturate or exceeded the number of faults allowed, the redundant rows are used to replace faulty memory cells until all memory cell faults are eliminated. Alternating between BIST and BISR is continued until BIST is run without any memory cell failures or until the redundant columns and rows are exhausted and the memory array is unuseable.

Figure 5:
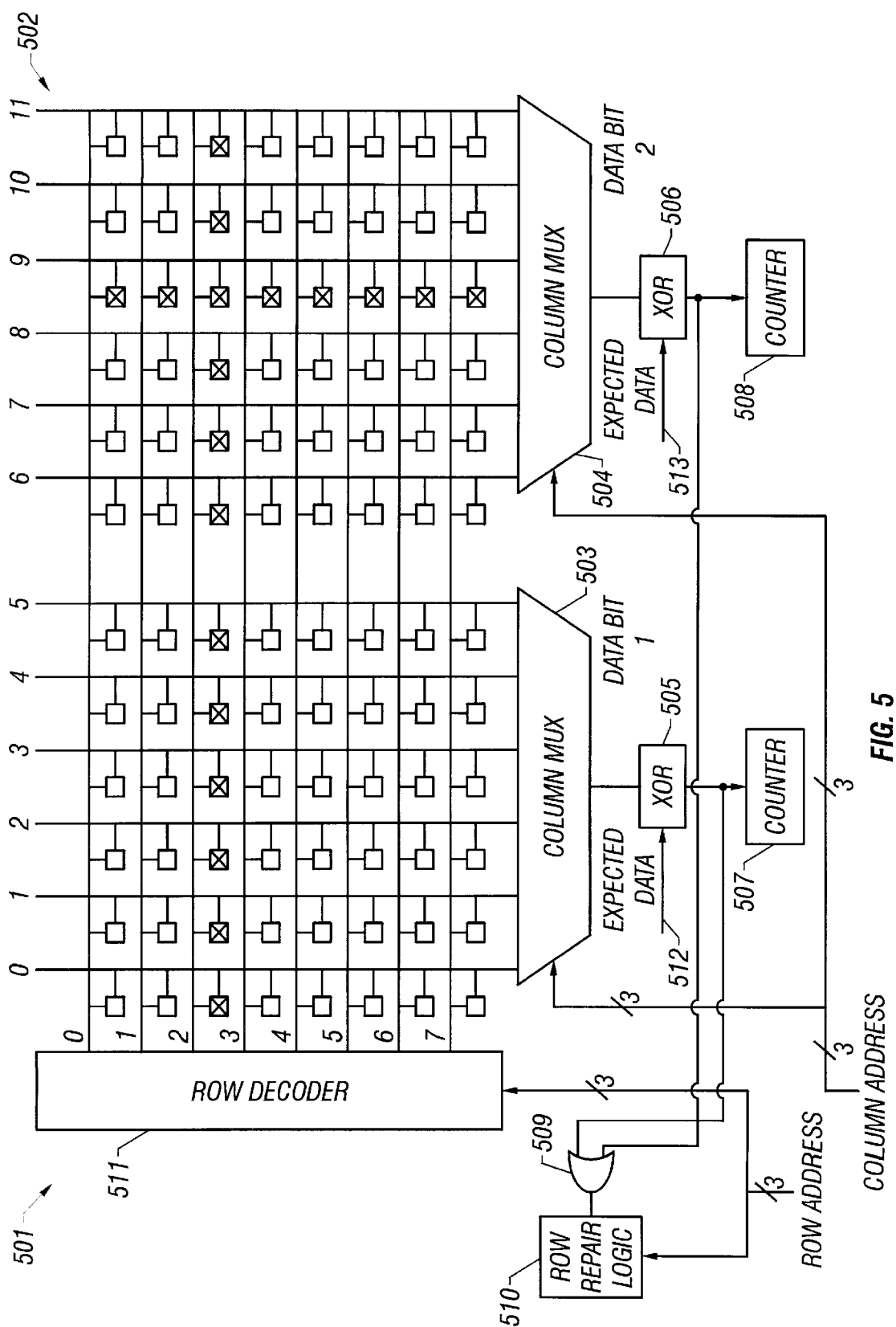
FIG. 5 is a diagram which shows a hardware implementation of an embodiment of the present invention.

FIG. 5 is a diagram which shows two memory arrays of six columns each (0–5 and 6–11) where each array has 8 rows (0–7). FIG. 5 includes memory array 501 and 502, two column multiplexers 503 and 504, exclusive "OR" (XOR) gates 505, 506, two counters 507 and 508, an OR gate 509, a row repair logic block 510 and a row decoder 511. To reduce the time required for testing, the memory contained in a device can be divided into separate memory arrays and all arrays tested simultaneously. BIST can be configured to simultaneously test column 0 of memory array 501 and column 6 of memory array 502 with the resulting test information applied to column multiplexers 503 and 504, respectively. (One of ordinary skill in the art would understand that this capability is not limited to testing two memory blocks simultaneous and can be expanded to simultaneously test several blocks as desired.) For instance, after a write "1" is applied to each memory cell in memory arrays 501 and 502, each memory cell is expected to contain the value one. Each cell's stored value is applied to the column multiplexers and the value stored in and read from the cell is compared in XOR gates 505 and 506 with the expected data 512 and 513. If the cell's stored value matches the expected value, the integer value stored in the counter (507 and 508) is not incremented. If, however, the values do not match, the corresponding counter 507 or 508 is incremented. As previously detailed, prior art correction techniques are fully described in U.S. Pat. Nos. 5,255,227, 5,848,077 and 6,000,047 which are incorporated herein in their entireties by reference.

Testing is continued in this manner until BIST is completed for each cell in each column and the values representing total failures or saturation values are associated with each column of each memory array. Once columns are identified which have failed BIST by having at least a predetermined number of failed cells, redundant columns are used to replace those columns. Row replacement with redundant rows is then used to replace rows which continue to contain a cell failure until all cell failures are eliminated from the memory array. Replacement of columns and rows is dependent on the availability of redundant columns and rows respectively. If an insufficient number of replacement rows are available to fully replace all rows having defective cells, any remaining spare columns may be used prior to deciding that the array cannot be fixed.

Typically, a spare row of memory cells is made to substitute for a defective row by transforming a row address signal to select the spare row instead of the defective row. Column substitutions are performed using multiplexers on the bit lines to switch between adjacent lines (or groups of adjacent lines), effectively shifting the defective column out, while providing access to a spare column (or columns) physically located at the end of the array. This technique is fully described in commonly assigned and co-pending U.S. patent application Ser. No. 09/506,620, entitled "Redundancy Programming Using Addressable Scan Paths to Reduce the Number of Required Fuses," filed Feb. 18, 2000, the disclosure which is hereby incorporated herein by reference.

Figure 6:
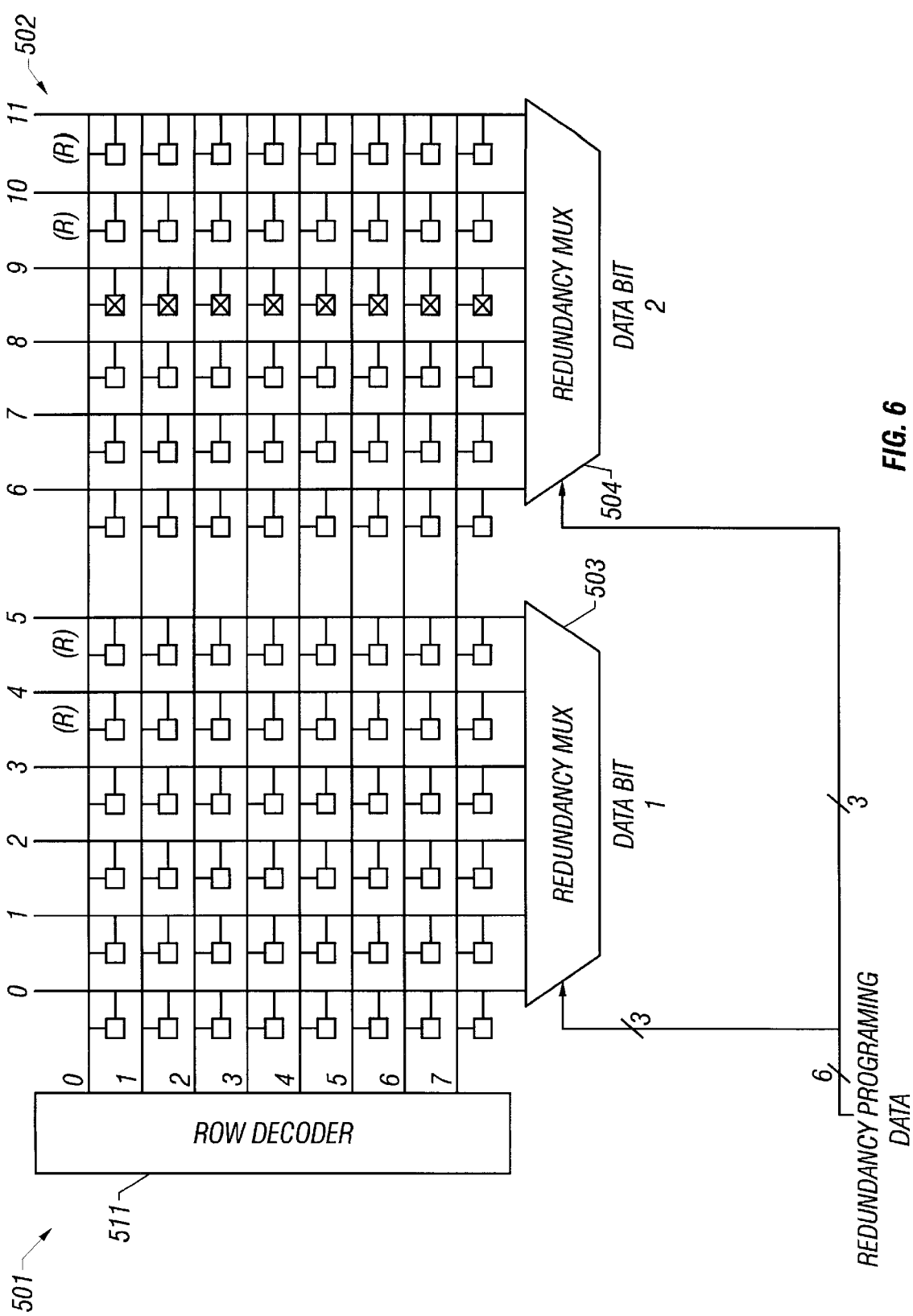
FIG. 6 is a diagram of the RAM array with redundancy multiplexers used to perform column replacement.

FIG. 6 is a diagram of the RAM array with redundancy multiplexers used for column replacements. In this embodiment, multiple columns can be replaced at a time. FIG. 6 contains two memory groups, 501 and 502 which contain four active or operational columns, columns 0 through 3 in memory group 501, and columns 6 through 9 in memory group 502 and two redundant columns in each memory group, columns 4 and 5 in memory group 501 and columns 10 & 11 in memory group 502. Redundancy multipliers 503 and 504 are programmed with redundancy programming data and are used to shift data around columns containing cells with faults. In the figure, each column included in the diagram can correspond to one or more adjacent columns of cells. For example, in the event that cells included in column 9 contained faults, as shown, column 10, a redundant column could be used instead of column 9. Column 11 remains as a redundant column for future use.

As previously described, addresses of rows which contain non-active or non-operational cells are typically stored and mapped to a redundant row. These row addresses may be stored in a content addressable memory (CAM). In a preferred embodiment, both cell testing and replacement of rows containing non-operational cells with redundant rows occur simultaneously, i.e., identification of faulty row address information is stored into the CAM immediately following cell testing and while subsequent rows are undergoing test. This simultaneous operation is used to minimize the amount of scratch memory needed to store row fault addresses and minimize time spent on testing and correcting the memory arrays.

Figure 7:
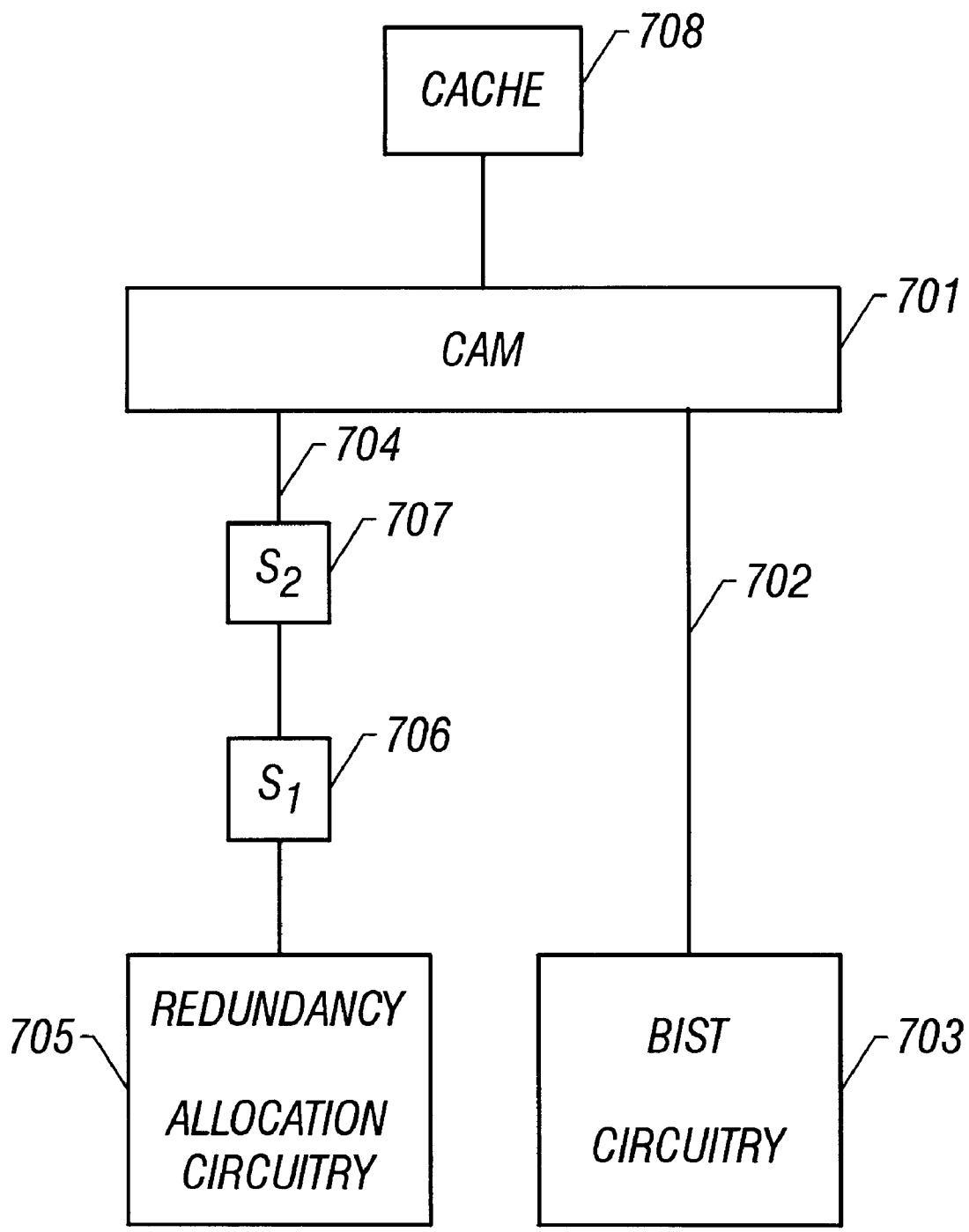
FIG. 7 is a block diagram of access to the content addressable memory by the redundancy allocation and BIST circuitry.

FIG. 7 is a block diagram of a content addressable memory (CAM) which stores row addresses of defective rows or groups of rows. CAM 701 is used to access rows which are currently being tested as well as to store the addresses of rows which need to be replaced. That is, CAM 701 provides any required address translation for defective row address space to substitute an appropriate address space in redundant memory, including address translation for testing.

CAM 701, appears externally to include two address input ports, or "ways" in which CAM 701 may be accessed. One of these ports 702 is used by BIST circuitry 703 to access specific rows of memory for testing the individual memory cells contained within it. Second port 704 is used by redundancy allocation circuitry 705 to store row addresses which contain non-operational cells. The row addresses typically are not stored nor are they accessed in a single clock cycle and a pipeline is typically included in port 704. In FIG. 7 a two stage pipeline consisting of a first stage 706 and a second stage 707 is shown. Redundancy allocation circuitry 705 may also include column and/or row thresholding logic used to determine when to make a column or row replacement. Alternatively, this logic may be implemented by BIST circuitry 703. Redundancy allocation circuitry 705 may further include logic for controlling Redundancy MUXES 503 and 504 to effect column configuration and replacement.

Internally, CAM 701 is single ported in that it performs one access operation at a time. When CAM 701 receives a write or read request of a specific memory address (note that, as far as CAM 701 is concerned, the referenced memory address is handled as data) from BIST circuitry 703, this request is passed through CAM 701 to memory cache 708. If the memory address matches a previously stored memory address space indicating a faulty section of memory, CAM 701 provides a match signal to effectuate a substitution of redundant memory for the faulty section of memory. Alternatively, when CAM 701 receives a row address from redundancy allocation circuitry 705, the row address passes through pipeline stages 706 and 707 to port 704 and is stored by the CAM and a replacement row is mapped. In a preferred embodiment, multiple rows may be grouped together and tested, and if necessary, replaced together. If, for instance, four rows of memory are grouped together, the least significant two bits may be ignored and the four rows of memory will be treated as a single entity.

Since two operations may be initiated at the same time, i.e., access from BIST circuitry on port 702 and storage of a row address corresponding to non-operational cells, while CAM 701 can only address one access operation at a time, a scheme must be developed to handle both incoming requests. The invention solves this conflict by assigning priority to the writing of the row address which contains the non-operational cell.

There is a fixed time delay between a row failure being detected and when the address of the row containing the non-operational cell reaches CAM 701. Priority can be given to the storing of the row address data into CAM 701 by extending those fixed time delays to eliminate conflicts. Correct operation of both the storage of the row address and BIST circuitry testing is assured by scheduling a BIST circuitry write to occur simultaneously with the CAM memory write. BIST circuitry writes can be scheduled to occur sequentially, with no intervening BIST circuitry read operations, to eliminate conflicts between a CAM write and a BIST circuitry read.

One of ordinary skill in the art would understand that the memory cell array, the supporting structure (including the address decoders, sense amplifiers, clocks, etc.) other structure (e.g., processor/controller, central processing unit, input/output devices, etc.) and built-in self test and built-in self repair are all formed as one integral chip or a semiconductor chip or die including a semiconductor substrate.

Figure 8:
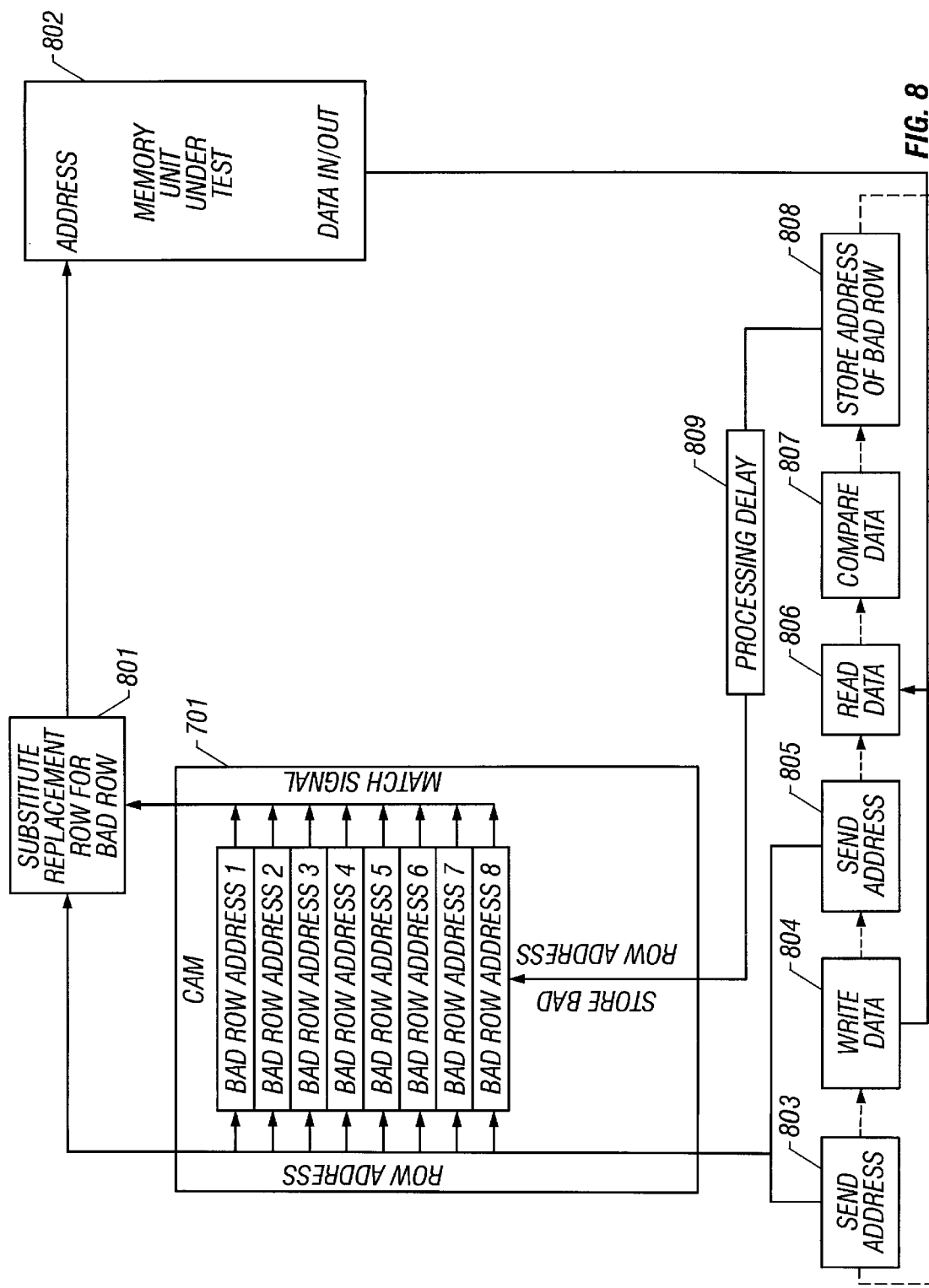
FIG. 8 is a diagram of BIST and BISR according to one embodiment of the invention.

FIG. 8 is a diagram showing the relative sequence of BIST followed by BISR, if required to reroute memory address requests to a redundant portion of memory. As depicted, CAM 701 (FIG. 7) includes eight content addressable memory locations, each storing, for example, the eleven high order bits of a memory address. If a cell address matches address space data stored in CAM 701, then an appropriate match signal is supplied to Row Address Substitution circuit 801. This may cause an address corresponding to an appropriate group of redundant rows to be substituted for the portion of the address designating a defective group of rows. The resultant address signal is then applied to memory 802, accessing a specified memory cell, so that data can be written into or read from the cell.

In this example, we assume that a certain number of the low order address bits are used to distinguish between minimum addressable units (for this example and purposes of illustration, bits) within a row and a particular row within a predefined minimum replaceable group size of rows, e.g., four rows. For example, a twenty bit address space may have the 7 least significant bits designating (i.e., addressing) one of 128 bits constituting a row, the next two most significant bits designating one of four rows within each four-row group, and the most significant eleven bits designating one of 2048 four-row groupings. Since rows are substituted in groups, the CAM need only store the eleven most significant bits of an address to determine if the address to be accessed is part of a four-row group address space previously determined to include a defective cell.

The BIST portion nominally includes five steps. Initially, an address of a cell to be tested in Memory 802 is generated at step 803, the address being supplied to CAM 701 for possible translation, i.e., remapping into redundant memory if the address supplied is part of a defective address space including a defective row of memory cells. If the address of the cell being tested has not previously been determined to fall withing the address space of a defective row group, then the address from step 803 is passed unchanged to the memory under test 802. Alternatively, if the high order bits of the address match an entry in CAM 701, then a match signal is produced initiating an access of corresponding redundant group of four rows, the least significant bits of the address are used to designate one of the four rows and a byte within that row as in the uncorrected case.

Once the appropriate address signal is supplied to memory unit under test 802, test data is written into the designated cell or cells at step 804. Reading from the cell or cells requires retransmitting the address of the cell under test at step 805 as previously described in connection with step 803. Now, however, data is read from the cell or cells at step 806 and, at step 807, this data is compared to the data as stored. A match indicates that the cell appears to be operational (subject to further testing), while a mismatch indicates a defect or fault. If a defect is identified, then the address of the corresponding row group is stored into CAM 701 at step 808. However, storage of the "bad" address group is subject to processing delay 809. Unfortunately, the delay causes a conflict between address data being written into CAM 701 and the next memory access starting at step 803. Thus, writing to CAM 701 may result in a change of address translation occurring between steps 803 and 806 so that test data may be stored into one cell location but read from a different location.

Figure 9:
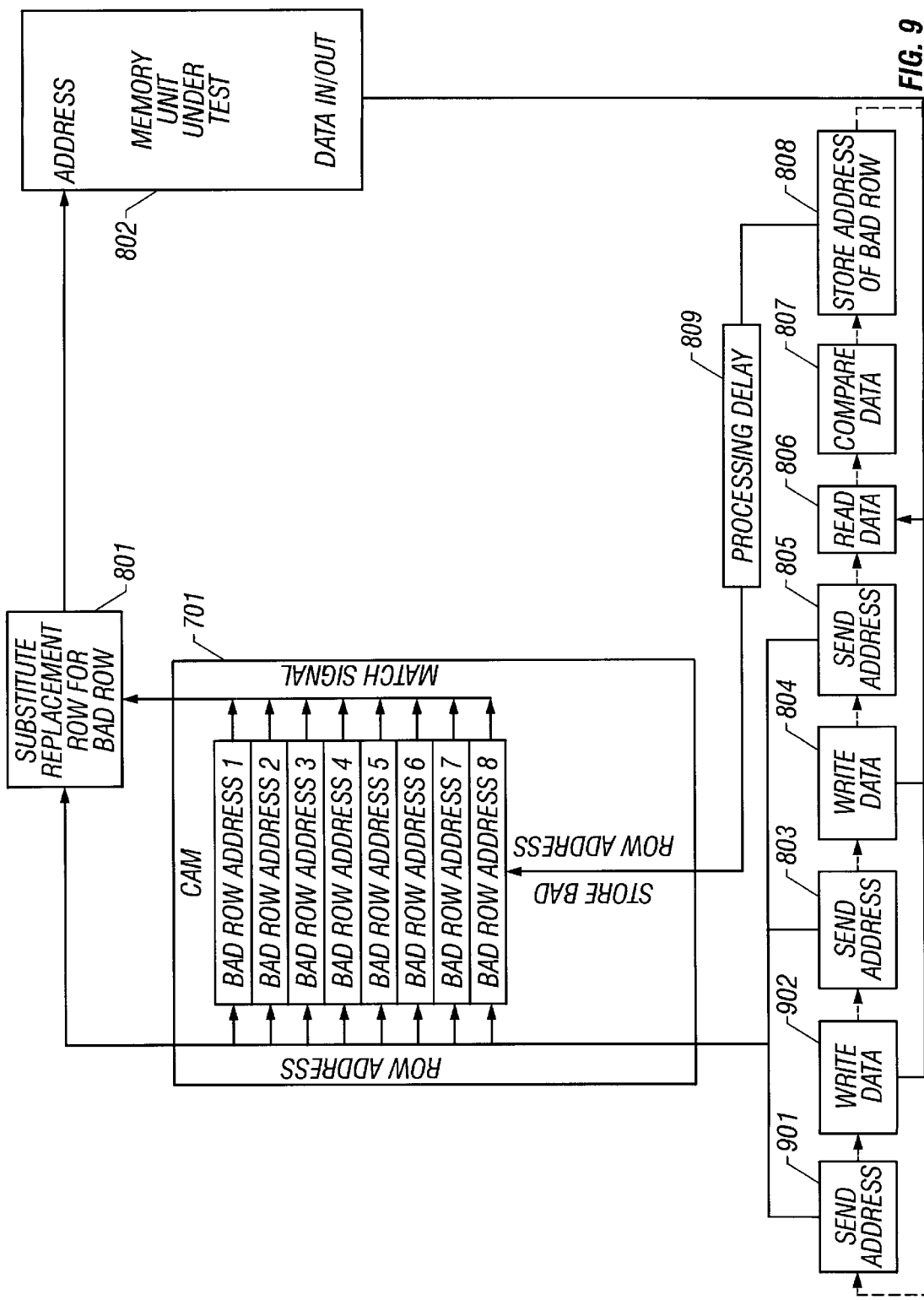
FIG. 9 is a design if BIST and BISR according to an alternate embodiment of the invention.

Referring to FIG. 9, a delay is introduced in the form of steps 901 and 902 so that updating of CAM 701 (FIG. 7) according to step 808 and subject to delay 809 is completed prior to storage of test data. In particular, steps 901 and 902 duplicate the actions of steps 801 and 802, respectively. Thus, the address of a cell under test is supplied to CAM 701 at step 901. In the case where step 808 is simultaneously implemented to provide updated address data to CAM 701, a conflict will result so that an erroneous address or no address may be supplied to memory 802 by step 901. This possibility results in data to be written into memory 802 not being properly stored in response to step 902. To accommodate failures to properly store test data into memory 802 caused by such conflicts, steps 803 and 804 repeat the process of supplying the address of the cell under test and data to be stored into the cell to assure the test data storage into the desired cell is properly accomplished. Processing then continues as detailed in connection with FIG. 8 to read the test data back out from the cell under test, compare the data as read to the data as written, and implement any required updates to CAM 701 to account for any defective memory cell identified by the test.

As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. While the current invention has been described using memory cell arrays, one of ordinary skill in the art would understand that the invention can be applied to any multicelled device in which retention of physical position is not important and redundant columns or rows of devices can be substituted for failed devices. For example, the invention is equally applicable to arrays of multipliers and adders.

What is claimed is:

1. A method of eliminating faulty memory cells from an active part of a memory array, the memory arranged in row groups and column groups and including spare column groups and spare row groups, the method comprising the steps of:

(i) setting a column replacement threshold value and a row replacement threshold value;

(ii) determining whether cells in each column group of the memory array are defective;

(iii) configuring said memory array to replace ones of said column groups that include more than said column replacement threshold value of defective cell with ones of said spare column groups;

(iv) determining whether cells in each row group of the memory array are defective; and (v) configuring said memory array to replace ones of said row groups that include more than said row replacement threshold value of defective cell with ones of said spare row groups.

2. The method of claim 1 wherein said column replacement threshold value is a function of an unused number of said spare row groups.

3. The method of claim 2 wherein said column replacement threshold value is equal to one more than said unused number of said spare row groups.

4. The method of claim 1 wherein said row replacement threshold value is a function of an unused number of said spare column groups.

5. The method of claim 4 wherein said row replacement threshold value is equal to one more than said unused number of said spare column groups.

6. The method of claim 1 wherein said steps (ii) through (v) are repeated until a determination that there are no remaining defective cells or there are no unused spare column groups and no unused spare row groups.

7. The method of claim 6 including a step of setting said column replacement threshold value to be equal to one more than an unused number of said spare row groups.

8. The method of claim 6 including a step of setting said column replacement threshold value to be equal to the lesser of one more than an unused number of said spare row groups and one less than a value of said column fault threshold value during a previous cycle.

9. The method of claim 1 wherein step (ii) further includes providing a count of a number of said cells in each column group of the memory array that are defective.

10. The method of claim 1 wherein said step (ii) further includes providing a count of a number of row groups including at least one defective cell.

11. A system for eliminating faulty memory cells from a memory array arranged in row groups and column groups and including spare column groups and spare row groups, the system comprising:
a memory cell tester for determining faulty memory cells;
column threshold logic operational to identify a column replacement threshold value as a function of a number of unused spare rows of memory cells;
column configuration logic operational to replace ones of said column groups that contain at least said column group threshold value of defective cells with ones of said spare column groups; and
row configuration logic operational to replace ones of said row groups that contain at least a predetermined number of defective cells with ones of said spare row groups.

12. The system according to claim 11 wherein said column threshold logic, column configuration logic and row configuration logic are configured to operate alternately replace defective cells with said spare column groups and said spare row groups.

13. The system according to claim 11 wherein said column threshold logic is operational to determine said column replacement threshold value in response to an unused number of said spare row groups.

14. The system according to claim 11 wherein said column threshold logic is operational to set said column replacement threshold value to be equal to one more than an unused number of said spare row groups.

15. The system according to claim 11 wherein said column threshold logic is operational to set said column replacement threshold value to be equal to the lesser of one more than an unused number of said spare row groups and one less than a value of said column fault threshold value during a previous cycle.

16. The system according to claim 11 wherein said predetermined number of defective memory cells is equal to one more than an unused number of said spare column groups.

17. A semiconductor device, comprising:
a memory array arranged in row groups and column groups and including spare column groups and spare row groups; and
memory cell test circuitry operable to:
determine whether cells in each column group of the memory array are defective; and
determine whether cells in each row group of the memory array are defective; and memory cell repair circuitry operable to:
configure said memory array to replace ones of said column groups that include more than a column replacement threshold value of defective cell with ones of said spare column groups, and
configure said memory array to replace ones of said row groups that include more than a row replacement threshold value of defective cell with ones of said spare row groups.

18. The semiconductor memory device according to claim 17 wherein said memory cell test circuitry and said memory cell repair circuitry are simultaneously operable to repair a first portion of said memory array while testing a second portion of said memory array.

19. The semiconductor memory device according to claim 17 wherein said memory cell test circuitry and said memory cell repair circuitry operate concurrently to test and repair said column groups and, subsequently, operate concurrently to test and repair said row groups.

20. The semiconductor memory device according to claim 17 further comprising circuitry operable to determine said column replacement threshold value as equal to one more than an unused number of said spare row groups.

* * * * *